(12) United States Patent
Bai et al.

(10) Patent No.: US 8,710,629 B2
(45) Date of Patent: Apr. 29, 2014

(54) APPARATUS AND METHOD FOR CONTROLLING SEMICONDUCTOR DIE WARPAGE

(75) Inventors: Xue Bai, San Diego, CA (US); Urmi Ray, Ramona, CA (US)

(73) Assignee: QUALCOMM Incorporated, San Diego, CA (US)

( * ) Notice: Subject to any disclaimer, the term of this patent is extended or adjusted under 35 U.S.C. 154(b) by 286 days.

(21) Appl. No.: 12/640,111

(22) Filed: Dec. 17, 2009

(65) Prior Publication Data

US 2011/0147895 A1 Jun. 23, 2011

(51) Int. Cl.
*H01L 23/00* (2006.01)
*H01L 21/768* (2006.01)
*G06F 17/50* (2006.01)

(52) U.S. Cl.
USPC ..... 257/618; 257/621; 257/774; 257/E23.174

(58) Field of Classification Search
USPC ........................ 257/618, 621, 774, E23.174
See application file for complete search history.

(56) References Cited

U.S. PATENT DOCUMENTS

| 5,148,036 | A | * | 9/1992 | Matsugu et al. | 250/548 |
| 6,087,719 | A | * | 7/2000 | Tsunashima | 257/686 |
| 6,214,643 | B1 | * | 4/2001 | Chiu | 438/108 |
| 6,372,600 | B1 | * | 4/2002 | Desko et al. | 438/406 |
| 6,841,469 | B2 | * | 1/2005 | Sawada et al. | 438/629 |
| 7,122,912 | B2 | * | 10/2006 | Matsui | 257/797 |
| 2003/0168744 | A1 | * | 9/2003 | Sawada et al. | 257/758 |
| 2005/0059217 | A1 | | 3/2005 | Morrow et al. | |
| 2006/0192287 | A1 | | 8/2006 | Ogawa et al. | |
| 2007/0164458 | A1 | * | 7/2007 | Ogino et al. | 257/797 |
| 2007/0216020 | A1 | * | 9/2007 | Shiraishi | 257/700 |
| 2009/0039471 | A1 | | 2/2009 | Katagiri | |
| 2010/0015797 | A1 | | 1/2010 | Saito et al. | |

FOREIGN PATENT DOCUMENTS

| JP | 2003197855 A | 7/2003 |
| TW | 200725865 | 7/2007 |
| WO | WO2007023950 A1 | 3/2007 |

OTHER PUBLICATIONS

International Search Report and Written Opinion—PCT/US2010/061143, International Search Authority—European Patent Office—Mar. 23, 2011.
Pathak M et al., "Performance and Thermal-Aware Steiner Routing for 3-D Stacked ICs" IEEE Transactions on Computer Aided Design of Integrated Circuits and Systems, IEEE Service Center, Piscataway, NJ, US, vol. 28, No, 9, Sep. 1, 2009, pp. 1373-1386, XP011272419, ISSN: 0278-0070, DOI: DOI:10.1109/TCAD.2009.2024707.

* cited by examiner

*Primary Examiner* — Peniel M Gumedzoe
(74) *Attorney, Agent, or Firm* — Michelle S. Gallardo

(57) ABSTRACT

A semiconductor die has through silicon vias arranged to reduce warpage. The through silicon vias adjust the coefficient of thermal expansion of the semiconductor die, permit substrate deformation, and also relieve residual stress. The through silicon vias may be located in the edges and/or corners of the semiconductor die. The through silicon vias are stress relief vias that can be supplemented with round corner vias to reducing warpage of the semiconductor die.

10 Claims, 4 Drawing Sheets

# APPARATUS AND METHOD FOR CONTROLLING SEMICONDUCTOR DIE WARPAGE

TECHNICAL FIELD

The present disclosure generally relates to semiconductor die manufacturing. More specifically, the present disclosure relates to controlling warpage while manufacturing semiconductor dies.

BACKGROUND

Residual stress in semiconductor wafers and dies causes warpage. For example, deposited materials (e.g., to create transistors) on the wafer can be engineered to have a different stress than the substrate resulting in unbalanced stress. In other cases, the stresses are not engineered but merely result from different materials. When the stress between the substrate and deposited materials is unbalanced, the substrate may warp or bend to reach an equilibrium stress.

In addition, change of temperature experienced by a packaged die can cause warpage. The coefficient of thermal expansion (CTE) of the package differs from the CTE of the die. Warpage occurs as a result of the CTE mismatch between the material sets of the package and die. The warpage is exacerbated when there is a substantial thickness difference between the package and the die.

One example of a product having a substantial thickness difference between the package and the die is a stacked IC. Thin wafers are conventionally used in stacked ICs to assist fabrication of through silicon vias. In some cases the die may be thinned to less than 50 microns without changing the thickness of a 1 mm package. As a result of the substantial thickness difference, severe warpage may occur.

When the warping is severe, inadequate bonding of the die to the package occurs. In other words, the warpage prevents some bumps or pillars from attaching to the substrate during the package assembly process. If the warpage occurs after assembly, the bumps or pillars may de-attach when an end user device is with the consumer.

As seen in FIG. 3, a warped package substrate 310 is not coupled to a warped die 320 in the center. That is, centrally located interconnects 330 do not contact the package substrate 310. Although not shown, the thermal mismatch can stress the interconnects 330 in the corner, disconnecting the package substrate 310 from the die 320.

In addition, interconnect fatigue life decreases when the coefficient of thermal expansion (CTE) between the die and package substrate are mismatched. When the temperature changes, the assembly bends to accommodate the mismatch in expansion. Based on measurements and mechanical models, warpage appears to occur at a periphery of the die, especially at the corners. The strain concentrated at the corner of chip results in a crack that propagates out from the corner. As the crack propagates, it opens up either the chip-underfill interface or another weak interface, causing either interconnect fatigue or electrical failure in the chip dielectric.

Although stress engineering solutions involving die dielectric interfaces exist, such solutions are relatively complex and expensive. Thus, a need exists for efficiently controlling warpage of a die.

BRIEF SUMMARY

According to an aspect of the present disclosure, a semiconductor die has through silicon vias located in a peripheral region. The through silicon vias reduce warpage of the semiconductor die.

In another aspect, a method for manufacturing a semiconductor die includes fabricating a plurality of non-signal carrying through silicon vias in a peripheral region of the semiconductor die to reduce warpage of the die.

In yet another aspect, a semiconductor die has means for increasing a coefficient of thermal expansion (CTE) of the semiconductor die located in a peripheral region of the semiconductor die. The CTE increasing means reduces warpage of the semiconductor die.

In still another aspect, a computerized method for designing a semiconductor die includes determining locations for stress relief through silicon vias in order to reduce die warpage.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

Figure 1:
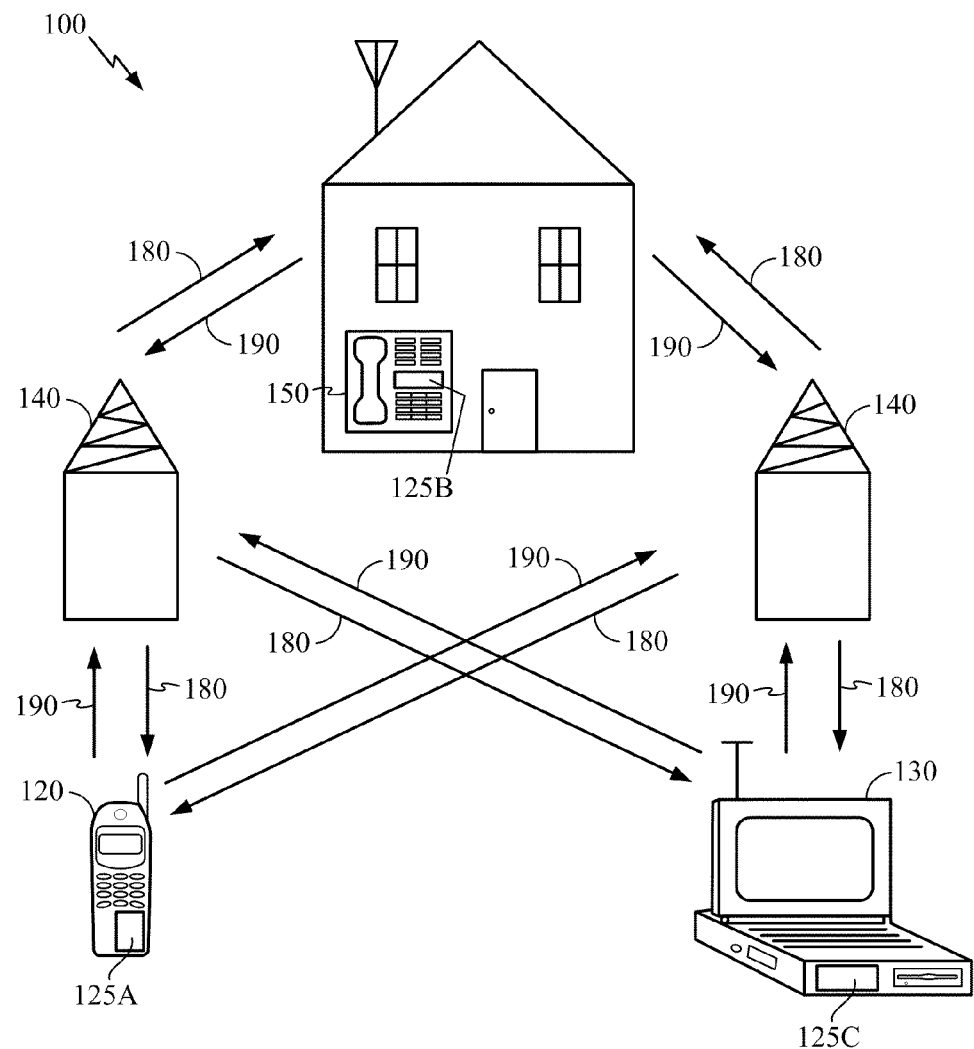
FIG. 1 is a block diagram showing an exemplary wireless communication system in which an embodiment of the invention may be advantageously employed.

FIG. 1 is a block diagram showing an exemplary wireless communication system 100 in which an embodiment of the disclosure may be advantageously employed. For purposes of illustration, FIG. 1 shows three remote units 120, 130, and 150 and two base stations 140. It will be recognized that wireless communication systems may have many more remote units and base stations. Remote units 120, 130, and 150 include IC devices 125A, 125B and 125C, that include the disclosed semiconductor die. It will be recognized that any device containing an IC may also include the die disclosed here, including the base stations, switching devices, and network equipment. FIG. 1 shows forward link signals 180 from the base station 140 to the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes integrated circuitry.

Figure 2:
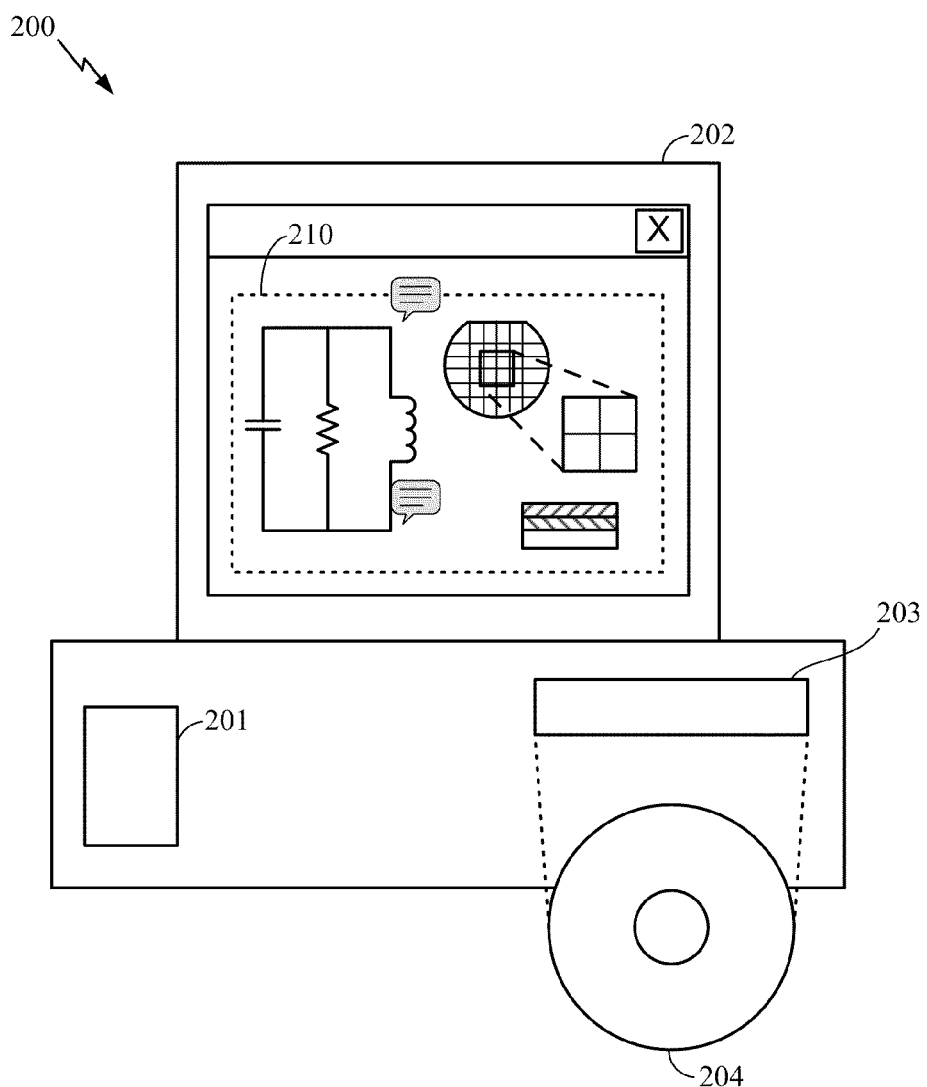
FIG. 2 is a block diagram illustrating a design workstation for circuit and layout design of the disclosed semiconductor die.
Figure 3:
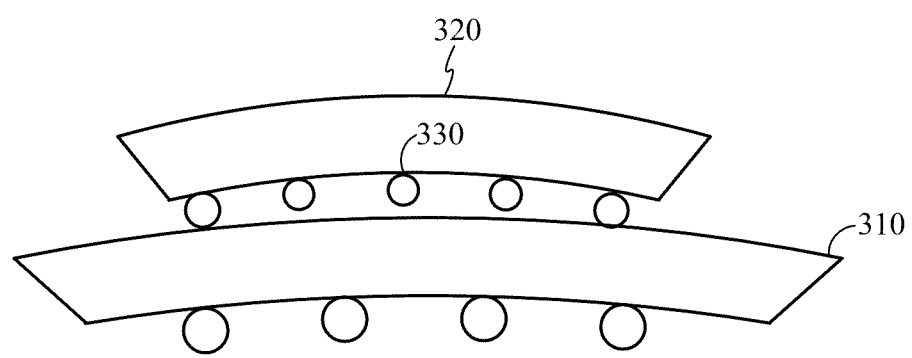
FIG. 3 is a block diagram illustrating a warped semiconductor die and packaging substrate.

FIG. 2 is a block diagram illustrating a design workstation for circuit and layout design of the disclosed semiconductor integrated circuit. A design workstation 200 includes a hard disk 201 containing operating system software, support files, and design software such as Cadence or OrCAD. The design workstation 200 also includes a display to facilitate design of a circuit and layout 210. The circuit and layout 210 may include the via configuration, as disclosed below. A storage medium 204 is provided for tangibly storing the circuit and layout design 210. The circuit and layout design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit and layout 210 by decreasing the number of processes for designing semiconductor ICs.

According to the present disclosure, through silicon vias with conductive fill (e.g., metal) are manufactured within a semiconductor die (or wafer) to control warpage. The through silicon vias improve the die/substrate coefficient of thermal expansion (CTE) match. Thus, fatigue life and reliability of the interconnect is increased.

Moreover, the through silicon vias relieve residual stress and create more space for the substrate to deform, mitigating warpage. In one embodiment, the through silicon vias are stress relief vias and round corner vias provided in a periphery of the die.

Figure 4:
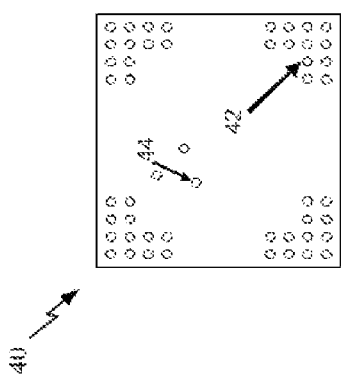
FIG. 4 is a block diagram illustrating a top view of a semiconductor die have stress relief vias.

As seen in FIG. 4, a die 40 includes stress relief vias 42. The stress relief vias are through silicon vias disposed around the die corner to control the warpage and also release the residual stress. In addition, stress relief vias 44 can be disposed centrally to redistribute residual stress. The stress relief vias 44 can help to reduce or increase stress of critical functional blocks of the die 40 to meet design parameters.

In one embodiment, the stress relief vias 42 are filled with metal, helping improve the coefficient of thermal expansion (CTE) mismatch. Exemplary non-limiting fill materials include copper and tungsten. Selection of the appropriate fill material depends on desired package performance and cost. Tungsten has a larger modulus but smaller coefficient of thermal expansion (CTE). For example in a stacked die (two tier) package, a tungsten fill material results in lower stress in the vias and higher stress in die to die interconnects between tiers of the stack. Therefore, a performance trade off exists between vias and interconnects when choosing the fill material.

In one embodiment, the stress relief vias 42, 44 do not carry signals. However, in another embodiment the stress relief vias 42, 44 do carry signals The number and exact locations of the stress relief vias 42, 44 varies from die to die based on, inter alia, the die size, the via diameter and the fill material of the stress relief via. The desired number of stress relief vias 42, 44 and locations of the stress relief vias 44 can be computed during the semiconductor die design phase by analyzing a thermal mechanical model of the die 40. One advantage of locating the stress relief vias 42 in the corner of the die is that this area is often not used for functional vias of the die 40.

Figure 5:
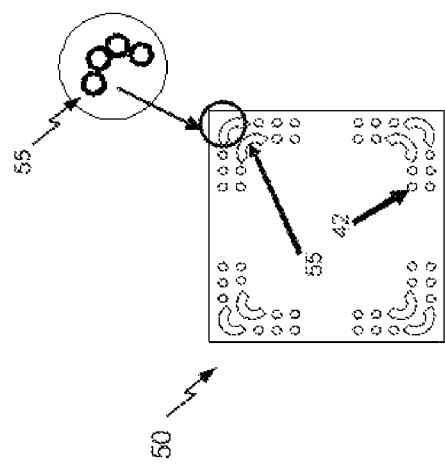
FIG. 5 is a block diagram illustrating a top view of a semiconductor die have stress relief vias and round corner vias.

As seen in FIG. 5, a die 50 includes round corner vias 55, in addition to stress relief vias 42. In one embodiment, the stress relief vias 42 are the primary mechanism for stress relief. If the stress relief vias are inadequate to relieve the stress by themselves, the round corner vias 55 are employed as a secondary mechanism. In another embodiment, the round corner vias 55 are the primary mechanism.

The round corner vias 55 can also be filled with metal to help increase the coefficient of thermal expansion of the die 50. By increasing the coefficient of thermal expansion of the die 50, the coefficient of thermal expansion of the die 50 will better match the coefficient of thermal expansion of the package (not shown), reducing the warpage. Moreover, the additional die cut out area creates more room for substrate deformation and relieves residual stress.

The format of the round corner via 55 can be varied. In one embodiment, as seen in the zoom view, the format is an array of through silicon vias.

The specific arrangement of round corner vias 55 and stress relief vias 42 can be determined based upon thermal mechanical modeling and the amount of expected warpage. If the warpage is more significant, round corner vias 55 can be provided because the round corner vias 55 remove more die material than the stress relief vias 42, giving the die 50 more space to deform. As a general rule of thumb, if the via area to die area ratio increases, then the warpage is more controlled. In other words, removing more die material better controls warpage.

In one embodiment, the area not used for the function of the die 50 influences the decision on where to locate the stress relief vias 42, 44 and the round corner vias 55. Alternatively, when the warpage issue becomes more critical, the functional blocks of the die 50 are designed to accommodate the stress relief vias 42, 44 and the round corner vias 55

The stress relief vias 42, 44 and the round corner vias 55 can be manufactured during the conventional through silicon via formation process. Therefore, no additional manufacturing processes are needed. Moreover, because the stress relief vias 42, 44 and the round corner vias 55 are easily manufactured, little to no extra manufacturing costs are added. Finally, the stress relief vias 42, 44 and the round corner vias 55 enhance reliability of package substrate/die interconnects by reducing the CTE mismatch. That is, the interconnect fatigue life is increased.

Although the terminology "through silicon via" includes the word silicon, it is noted that through silicon vias are not necessarily constructed in silicon. Rather, the material can be any device substrate material.

Although the present invention and its advantages have been described in detail, it should be understood that various changes, substitutions and alterations can be made herein without departing from the technology of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor die comprising:
a plurality of through substrate vias in each of four corners of the semiconductor a die, each of the four corners of the semiconductor die including:
an outer set of substrate vias arranged in an arc with the apex of the arc being aligned with a point of the corner in which the arc is located and an outer row of substrate vias extending outward from each of the ends of said arc in a direction parallel to a side edge of the semiconductor die along which the outer row of substrate vias extend, the through substrate vias reducing warpage of the semiconductor die.

2. The semiconductor die of claim 1, in which the through substrate vias are non-signal carrying through substrate vias, and wherein each of the four corners of the die further include:
an inner set of substrate vias arranged to form an inner arc with the apex of the inner arc being aligned with the point of the corner in which the inner arc is located and an inner row of substrate vias extending outward from each of the ends of said inner arc in a direction parallel to the side edge of the semiconductor die along which the outer row of substrate vias extend.

3. The semiconductor die of claim 2, further comprising at least one additional non-signaling carrying through substrate via located in a central region proximate to a functional block of the semiconductor die.

4. The semiconductor die of claim 2, in which the through substrate vias comprise stress relief vias.

5. The semiconductor die of claim 2, wherein more die material is removed in the areas formed by the arcs of the inner and outer sets of set of substrate vias than is removed in a die area of an equal size along which the inner and outer rows of substrate vias extend.

6. The semiconductor die of claim 2, wherein the inner row and outer rows of substrate vias extending from a corner of the die terminate at the same distance from the side of the die which extends perpendicular to the direction of the inner and outer rows.

7. The semiconductor die of claim 1, integrated into a handheld device, a portable computer, a cell phone, a fixed location remote unit, a mobile telephone, a portable data unit, a hand-held personal communication systems unit, a personal data assistant, a meter reading equipment, a fixed location data unit and/or a personal computer.

8. The semiconductor die of claim 1, integrated into a stacked IC.

9. A semiconductor die comprising:
means for increasing a coefficient of thermal expansion (CTE) of the semiconductor die, the CTE increasing means comprising a plurality of through substrate vias in each of four corners of the semiconductor die, each of the four corners of the semiconductor die including:
an outer set of substrate vias arranged in an arc with the apex of the arc being aligned with a point of the corner in which the arc is located and an outer row of substrate vias extending outward from each of the ends of said arc in a direction parallel to a side edge of the semiconductor die along which the outer row of substrate vias extend, the CTE increasing means reducing warpage of the semiconductor die; and
at least one additional non-signaling carrying through substrate via located in a central region proximate to a functional block of the semiconductor die.

10. The semiconductor die of claim 9, integrated into a portable computer, a cell phone, a fixed location remote unit, a mobile telephone, a portable data unit, a hand-held personal communication systems unit, a personal data assistant, a meter reading equipment, and/or a fixed location data unit.

\* \* \* \* \*